United States Patent
Cheng

(10) Patent No.: US 7,638,404 B2
(45) Date of Patent: Dec. 29, 2009

(54) METHOD FOR FORMING LOW TEMPERATURE POLYSILICON THIN FILM TRANSISTOR WITH LOW DOPED DRAIN STRUCTURE

(75) Inventor: Yi-Sheng Cheng, Kaohsiung (TW)

(73) Assignee: AU Optronics Corp., Hsinchu (TW)

( * ) Notice: Subject to any disclaimer, the term of this patent is extended or adjusted under 35 U.S.C. 154(b) by 436 days.

(21) Appl. No.: 11/368,441

(22) Filed: Mar. 7, 2006

(65) Prior Publication Data

US 2006/0216874 A1  Sep. 28, 2006

(30) Foreign Application Priority Data

May 27, 2005  (TW) ............... 94117437 A

(51) Int. Cl.
*H01L 21/84* (2006.01)
*H01L 21/00* (2006.01)
(52) U.S. Cl. .............. 438/309; 438/149; 438/163; 257/E21.205; 257/E29.151; 257/E51.005
(58) Field of Classification Search ......... 438/149–165; 257/192, 288, 387, 412, E21.205, E51.005, 257/E29.151
See application file for complete search history.

(56) References Cited

U.S. PATENT DOCUMENTS

| | | | | |
|---|---|---|---|---|
| 6,365,497 B1 * | 4/2002 | Gonzalez | ............... | 438/593 |
| 6,511,870 B2 * | 1/2003 | Chen et al. | ............. | 438/163 |
| 6,544,873 B1 * | 4/2003 | Yeom et al. | ............ | 438/588 |
| 6,596,598 B1 * | 7/2003 | Krivokapic et al. | ........ | 438/301 |
| 6,624,473 B1 * | 9/2003 | Takehashi et al. | ......... | 257/344 |

* cited by examiner

*Primary Examiner*—Alexander G Ghyka
*Assistant Examiner*—Leonard Chang
(74) *Attorney, Agent, or Firm*—Birch, Stewart, Kolasch & Birch, LLP

(57) ABSTRACT

A method for forming a low temperature polysilicon thin film transistor with a low doped drain structure comprises: a) forming a polysilicon island on a substrate; b) forming a dielectric layer, a metal layer and a cap layer in sequence cover to the polysilicon island; c) forming a photo-resist patterned layer on the cap layer; d) removing the portion of the metal layer and the portion of the cap layer which are uncovered by the photo-resist patterned layer, and the remaining metal layer is uncovered by the remaining cap layer with a predetermined distance at the same side; e) performing a high concentration ion-doping using the metal layer as a mask; f) removing the portion of the metal layer uncovered by the remaining cap layer; and g) performing a low concentration ion-doping using the metal layer as a mask.

14 Claims, 4 Drawing Sheets

METHOD FOR FORMING LOW TEMPERATURE POLYSILICON THIN FILM TRANSISTOR WITH LOW DOPED DRAIN STRUCTURE

BACKGROUND OF THE INVENTION (1) Field of the Invention

The present invention generally relates to a method for forming low temperature polysilicon thin film transistor, and particularly, to a method for forming low temperature polysilicon thin film transistor with a low doped drain structure.

(2) Description of the Prior Art

Thin film transistor-liquid crystal display (TFT-LCD) is currently the most popular product in the display market. The liquid crystal display technology grows fast, and competition in this art is very intense. The know how about enhancing efficiency and reliability of thin film transistor and about cost down are all the most important issues today. To enhance efficiency of thin film transistor, developing new material or advanced structure are both the practicable ways. Considering that "leakage current" is a major reason of power-waste, using silicon insulating layer, high-K gate or other skills to reduce the leakage current are the known solutions. As to the structural solution, one remarkable technique is doping low concentration ions at the intra-gate region of thin film transistor, which is capable of reducing transverse electrical resistance and resulting in high efficiency thin film transistor, namely low temperature polysilicon thin film transistor with low doped drain structure.

Referring to FIG.1A and FIG. 1B, which illustrate a method for forming a low temperature polysilicon thin film transistor with a low doped drain structure according to a prior art. As shown in FIG. 1A, a substrate 10, which is transparent and insulated, is firstly provided. A polysilicon island 12 is further formed on the substrate 10. Then, a dielectric layer 14 is deposited to cover with the polysilicon island 12. In prior arts, a photo-resist patterned layer 16 is formed on the dielectric layer 14. Following, a high concentration ion-doping is performed using the photo resist patterned layer 16 as mask, so as to form heavily doped region 123 (either N$^+$ region or P$^+$ region). And the other region of the polysilicon island 12 right beneath the photo-resist patterned layer 16 is an un-doped region 121.

As shown in FIG. 1B, after the photo-resist patterned layer 16 is removed, a gate 18 is defined and formed on the dielectric layer 14. The gate 18 has a width smaller than the photo-resist patterned layer 16. Then, a low concentration ion-doping is performed using the gate 18 as mask, so as to form low doped region 122 (either N$^-$ region or P$^-$ region). Thus, mentioned low doped drain structure is completed, and the remaining un-doped region 121 right beneath the gate 18 is used as channel within the thin film transistor.

Accordingly, the prior method for forming low temperature polysilicon thin film transistor with low doped drain structure needs at least one added photo mask to define and form the photo-resist patterned layer 16. The added photo mask not only brings external cost, it also leads to a complicated fabrication process. Besides, during the photo etching process, aligning inaccuracy usually results in shifting of the low doped drain structure, and yield is thus limited. Therefore, a fabrication method without added photo mask is greatly desired.

SUMMARY OF THE INVENTION

An objective of the present invention is to provide a fabrication method without added photo mask for forming low temperature polysilicon thin film transistor with low doped drain structure.

Another objective of the present invention is to improve the drawbacks of external cost and complicated process resulted from the added photo mask.

Another objective of the present invention is to improve the drawback of the shifting of the low doped drain structure.

A method for forming a low temperature polysilicon thin film transistor with a low doped drain structure is provided. The method substantially comprises:

a) forming a polysilicon island on a substrate.

b) forming a dielectric layer, a metal layer and a cap layer in sequence to cover the polysilicon island.

c) forming a photo-resist patterned layer on the cap layer.

d) removing a portion of the metal layer and a portion of the cap layer which are uncovered by the photo-resist patterned layer, so that the remaining metal layer is uncovered by the remaining cap layer with a predetermined distance at the same side.

e) performing a high concentration ion-doping using the metal layer as a mask to form a heavily doped region in the portion of the polysilicon island uncovered by the metal layer.

f) removing the portion of the metal layer uncovered by the remaining cap layer.

g) performing a low concentration ion-doping using the metal layer as a mask to form a low doped region in the portion of the polysilicon island.

These and other objectives of the present invention will no doubt become obvious to those of ordinary skill in the art after reading the following detailed description of the preferred embodiment which is illustrated in the various figures and drawings.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
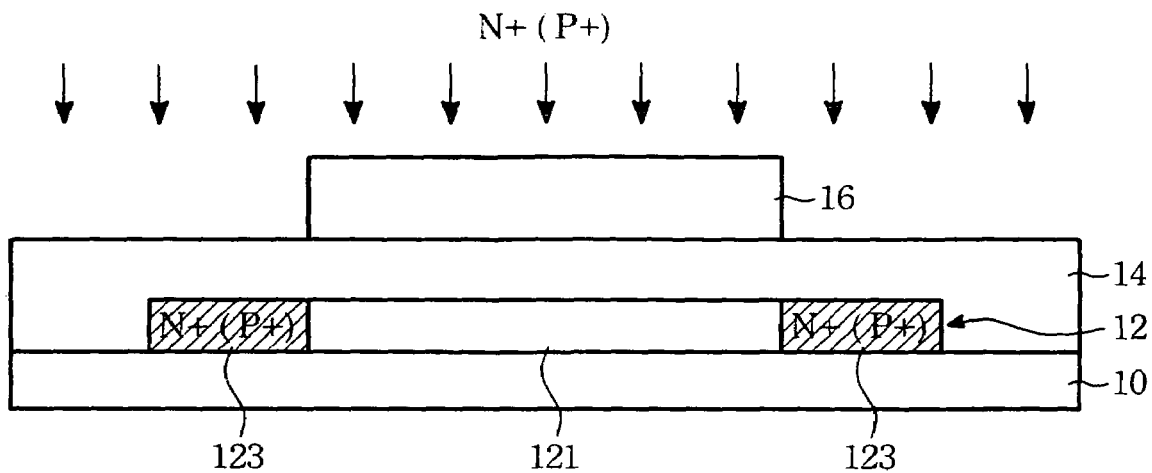
FIG. 1A to FIG. 1B illustrate a method for forming a low temperature polysilicon thin film transistor with a low doped drain structure according to a prior art.
Figure 1:
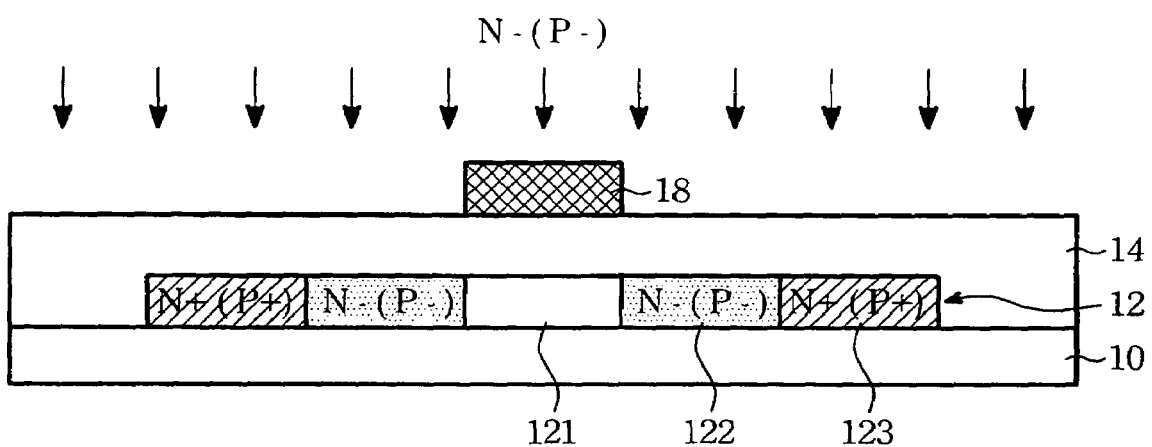
Figure 2A:
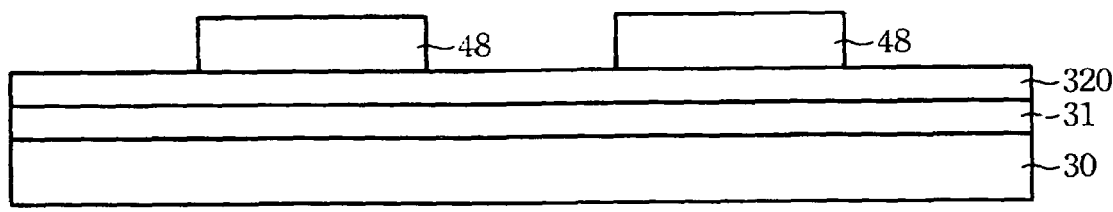
FIG. 2A to FIG. 2H, which illustrate a method for forming a low temperature polysilicon thin film transistor with a low doped drain structure according to the present invention.
Figure 2B:
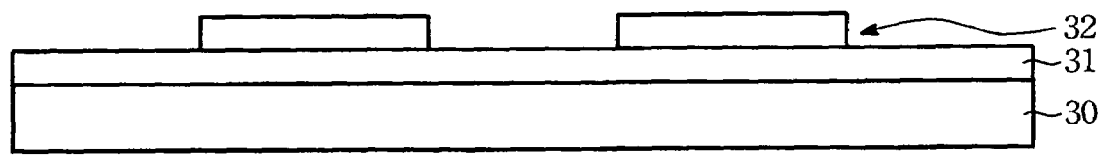

Referring to FIG. 2A to FIG. 2H, which illustrate a method for forming a low temperature polysilicon thin film transistor with a low doped drain structure according to the present invention. As shown in FIG. 2A, a substrate 30, which is transparent and insulated, is provided firstly. Following, a buffer layer 31 is formed on the substrate 30. As shown in FIG. 2A, the buffer layer 31 covers an entire surface of the substrate 30. The next step is forming a polysilicon island 32 on the substrate 30. In practice, amorphous silicon (α-Si) precursor is deposited over the buffer layer 31. Excimer laser annealing method is used toward the amorphous silicon precursor for obtained polysilicon layer 320. The polysilicon layer 320 comprises polycrystalline silicon material. After the polysilicon layer 320 has been formed on the buffer layer 31. At least one photo-resist 48 having specific pattern and etching method is used to form at least one polysilicon island 32, as shown in FIG. 2B.

Figure 2C:
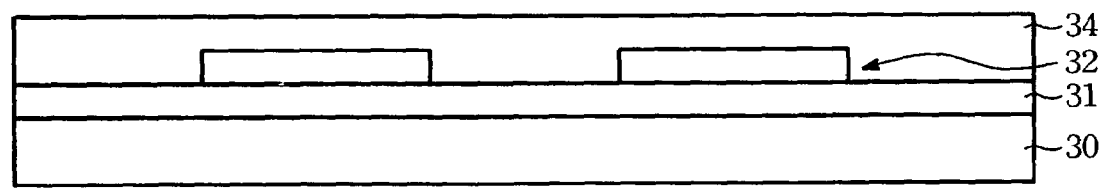
Figure 2D:
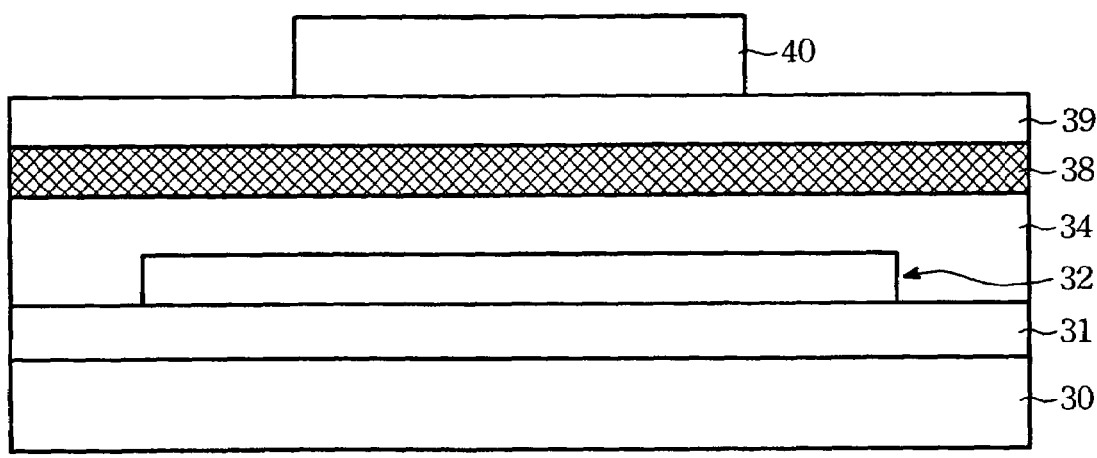

Referring to FIG. 2C and FIG. 2D, after the polysilicon island 32 has been formed, the next step is forming a dielectric layer 34, a metal layer 38 and a cap layer 39 in sequence to cover the polysilicon island 32 and the entire surface of the substrate 32. As shown in FIG. 2C, the dielectric layer 34 is formed by deposit method. The metal layer 38 shown in FIG. 2D is formed by sputtering. Then the cap layer 39 is also deposited over the metal layer 38.

Please still refer to FIG. 2D, the next step is forming a photo-resist patterned layer 40 on the cap layer 39. Among the various embodiments of the present invention, the photo-resist patterned layer 40 is made of a positive-typed photo resist or a negative-typed photo resist, and the cap layer 39 comprises silicon nitride ($Si_xN_y$), silicon oxide ($SiO_z$), silicon oxynitride ($SiO_zN_y$), or combinations thereof.

Figure 2E:
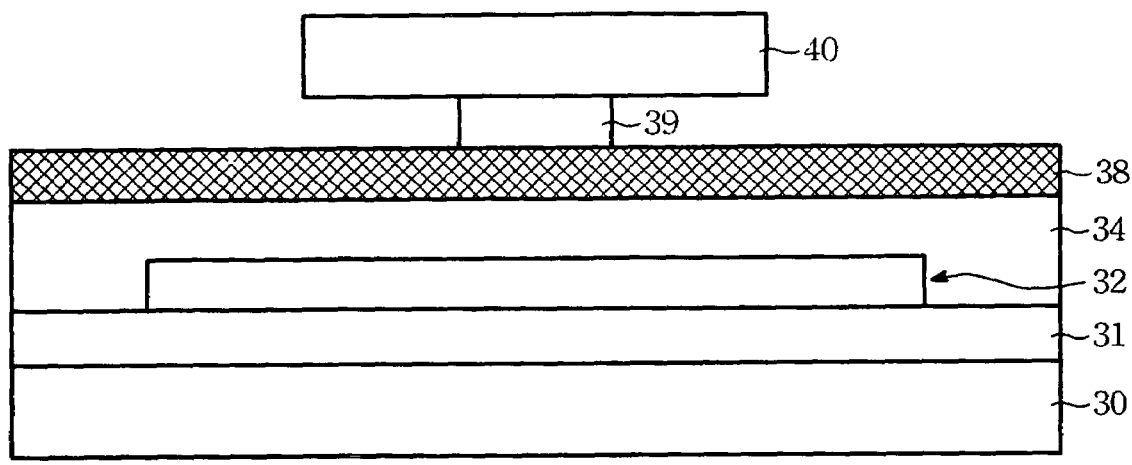
Figure 2F:
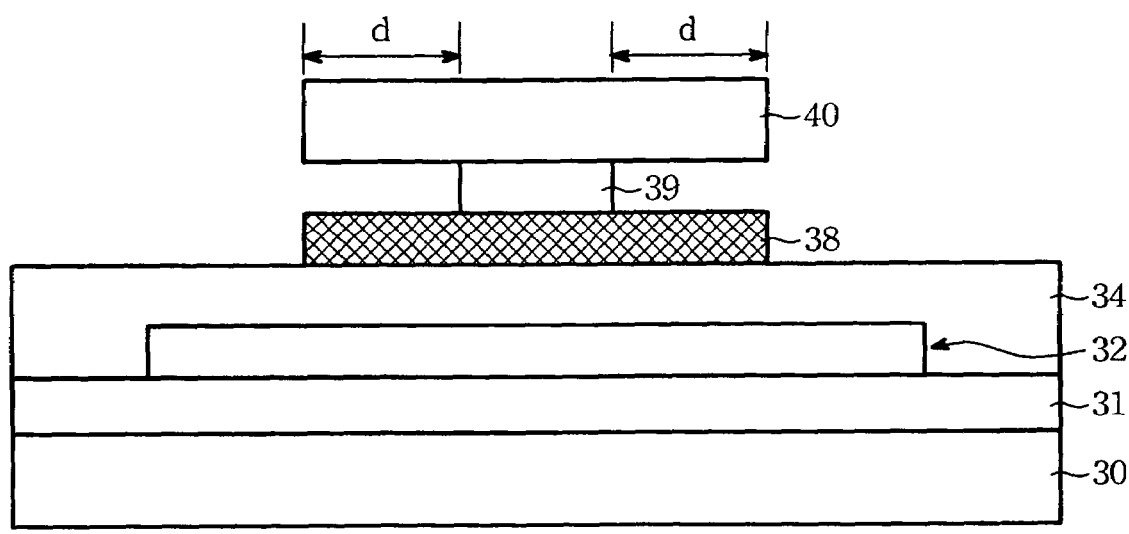

Next, please refer to FIG. 2E and FIG. 2F. After the photo-resist patterned layer 40 is formed, the next step is removing a portion of the metal layer 38 and a portion of the cap layer 39 which are uncovered by the photo-resist patterned layer 40, so that the remaining metal layer 38 is uncovered by the remaining cap layer 40 with a predetermined distance "d" at the same side shown in FIG. 2F.

In practice, two sub-steps is used for obtaining the structure shown in FIG. 2F in sequence. The first sub-step is performing a wet etching method to over-etch the cap layer 39. As a result, the cap layer 39 has been changed its size from the original structure shown in FIG. 2D to the structure shown in FIG. 2E. The second sub-step is performing a dry etching method using the photo-resist patterned layer 40 as mask to remove the metal layer uncovered by the photo-resist patterned layer 40. As a result, the remaining cap layer 39 has the predetermined distance "d" from an edge of the remaining metal layer 38. According to the preferred embodiments, the predetermined distance "d" is equal to or greater than about 0.3 micrometer (μm). In other words, previously mentioned predetermined difference between the second width and the first width is at least about 0.6 micrometer (μm). After the structure shown in FIG. 2F has been formed, the photo-resist patterned layer 40 is able to be removed.

Figure 2G:
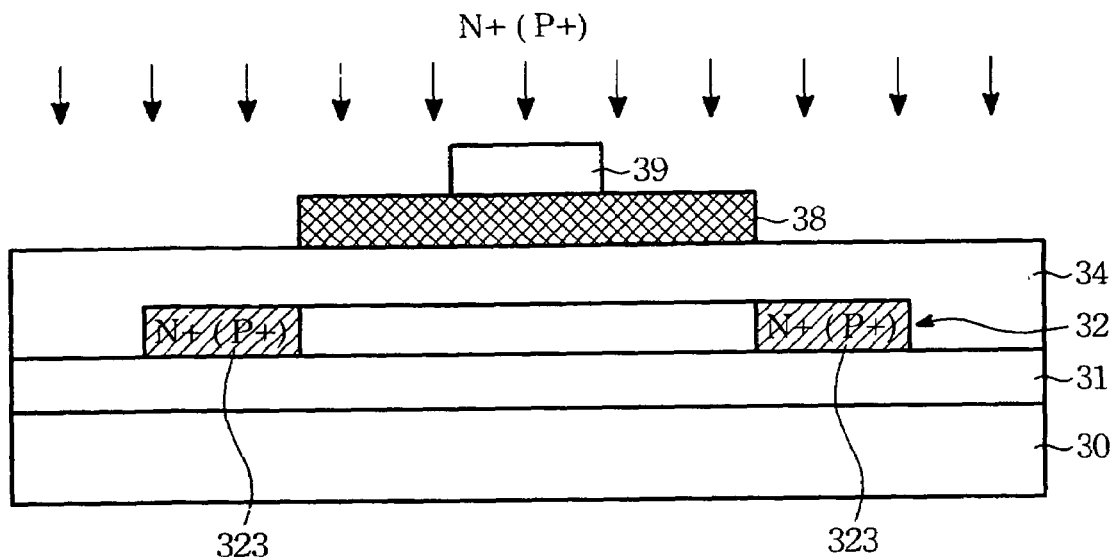
Figure 2H:
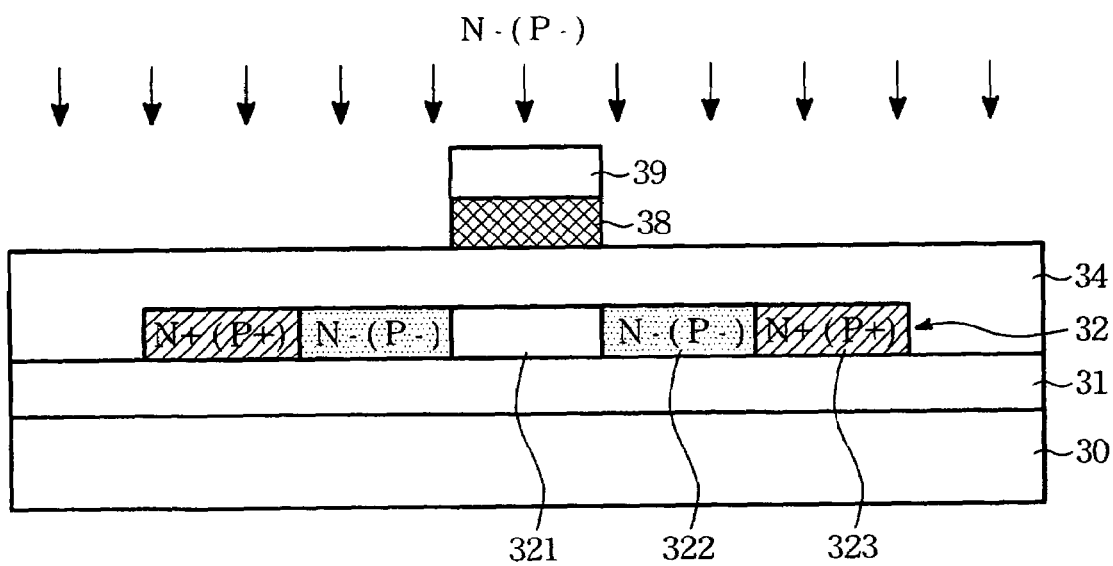

Referring to FIG. 2G, the next step is performing a high concentration ion-doping using the metal layer 38 as mask to form a heavily doped region 323 (either $N^+$ region or $P^+$ region) in the portion of the polysilicon island 32 uncovered by the metal layer 39. After the heavily doped region 323 has been doped with ions reaching its predetermined concentration, the next step is able to be proceeded. The next step after that is removing the portion of the metal layer 38 uncovered by the remaining cap layer 39 shown in FIG. 2G. Here, a dry etching method is used to remove the metal layer 38 uncovered by the remaining cap layer 39, so as to deform the metal layer 38 as a shape corresponding to the cap layer 39. As shown in FIG. 2H, the resulted metal layer 38 is the final structure of gate (gate of the thin film transistor) of the present invention. In one embodiment, the cap layer 39 is still reserved during the next step is proceeded. Alternatively, in another embodiment, the cap layer 39 is able to be removed before the next step.

Referring to FIG. 2H, the next step is performing a low concentration ion-doping using the metal layer 38 as mask to form a low doped region 322 (either $N^-$ region or $P^-$ region) in the polysilicon island 32, and the remaining un-doped region 321 of the polysilicon island 32 right beneath the metal layer 38 (the gate) is used as channel of the present thin film transistor. After the low doped region 322 has been doped with predetermined concentration of ions, an activation process is performed to activate the charged ions within the heavily doped region 323 and the low doped region 322, so as to activate the polysilicon island 32 as a semiconductor. The temperature of the activation process ranges from about 400 Celsius Degree to about 1000 Celsius Degree.

Accordingly, the present invention needs no added photo mask to define the LDD pattern or to form the low doped drain structure. As mentioned in the above detail descriptions, the present invention utilizes the cap layer to change the width of the metal layer step by step. Therefore, the metal layer is capable playing the different roles of different masks at different steps. As a result, not only the added mask for forming the low doped drain structure of prior art is able to be prevented, which also reduces at least one photo-etching step and leads to an advantage of cost down, further more, the prior drawback of the shifting low doped drain structure is also improved. The overall advantages of the present invention is very obvious.

With the example and explanations above, the features and spirits of the invention are hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method for forming a low temperature polysilicon thin film transistor with a low doped drain structure, comprising:
   forming a polysilicon island on a substrate;
   forming a dielectric layer, a metal layer and a cap layer in sequence to cover the polysilicon island, wherein the cap layer comprises silicon nitride ($Si_xN_y$), silicon oxide ($SiO_z$), silicon oxynitride ($SiO_zN_y$), or combinations thereof;
   forming a photo-resist patterned layer on the cap layer;
   removing a portion of the metal layer and a portion of the cap layer which are uncovered by the photo-resist patterned layer, so that the remaining metal layer is uncovered by the remaining cap layer with a predetermined distance at the same side, wherein the photo-resist patterned layer on the cap layer is not removed during the step of removing the portion of the metal layer and the portion of the cap layer;
   performing a high concentration ion-doping to form a heavily doped region in the portion of the polysilicon island uncovered by the remaining metal layer, wherein the metal layer is served as a mask in the step of performing a high concentration ion-doping;
   removing the portion of the remaining metal layer uncovered by the remaining cap layer to form a patterned metal layer, wherein a side of the remaining cap layer is substantially aligned with a side of the patterned metal layer at the same side; and
   performing a low concentration ion-doping using the patterned metal layer as a mask to form a low doped region in the portion of the polysilicon island.

2. The method of claim 1, further comprising forming a buffer layer on the substrate before the step of forming a polysilicon island on a substrate.

3. The method of claim 1, wherein the predetermined distance is equal to or greater than about 0.3 micrometer (μm).

4. The method of claim 1, wherein removing the portion of the metal layer and the portion of the cap layer which are uncovered by the photo-resist patterned layer comprises performing a dry etching process or a wet etching process.

5. The method of claim 1, wherein removing the portion of the metal layer uncovered by the remaining cap layer comprises performing a dry etching process or a wet etching process.

6. The method of claim 1, wherein the photo-resist patterned layer is made of a positive-typed photo resist or a negative-typed photo resist.

7. The method of claim 1, wherein removing the portion of the metal layer and the portion of the cap layer which are uncovered by the photo resist patterned layer comprises:

performing wet etching to over-etch the cap layer; and performing dry etching to remove the portion of the metal layer uncovered by the photo-resist patterned layer, wherein the photo-resist patterned layer is served as a mask in the step of performing dry etching.

8. A method for forming a low temperature polysilicon thin film transistor with a low doped drain structure, comprising:

forming a polysilicon island on a substrate;

forming a dielectric layer, a metal layer and a cap layer in sequence to cover the polysilicon island;

forming a photo-resist patterned layer on the cap layer;

removing a portion of the metal layer and a portion of the cap layer which are uncovered by the photo-resist patterned layer, wherein the width of the remaining cap layer is smaller than the width of the remaining metal layer, and the difference between the width of the remaining cap layer and that of the remaining metal layer is within a predetermined range, wherein the photo-resist patterned layer on the cap layer is not removed during the step of removing the portion of the metal layer and the portion of the cap layer;

performing a high concentration ion-doping using the metal layer as a mask to form a heavily doped region in the portion of the polysilicon island uncovered by the metal layer;

removing the portion of the metal layer uncovered by the remaining cap layer, wherein removing the portion of the metal layer and the portion of the cap layer which are uncovered by the photo-resist patterned layer comprises performing wet etching to over-etch the cap layer; and performing dry etching using the photo-resist patterned layer as a mask to remove the portion of the metal layer uncovered by the photo-resist patterned layer; and performing a low concentration ion-doping to form a low doped region in the portion of the polysilicon island, wherein the metal layer is served as a mask in the step of performing a low concentration ion-doping.

9. The method of claim 8, further comprising forming a buffer layer on the substrate before the step of forming a polysilicon island on a substrate.

10. The method of claim 8, wherein the predetermined range is equal to or greater than about 0.6 micrometer (μm).

11. The method of claim 8, wherein removing the portion of the metal layer and the portion of the cap layer which are uncovered by the photo resist patterned layer comprises performing a dry etching process or a wet etching process.

12. The method of claim 8, wherein removing the portion of the metal layer uncovered by the remaining cap layer comprises performing a dry etching process or a wet etching process.

13. The method of claim 8, wherein the cap layer comprises silicon nitride ($Si_xN_y$), silicon oxide ($SiO_z$), silicon oxynitride ($SiO_zN_y$), or combinations thereof.

14. The method of claim 8, wherein the photo-resist patterned layer is made of a positive-typed photo resist or a negative-typed photo resist.

* * * * *